United States Patent [19]

Bjorkholm

[11] Patent Number: 4,518,456
[45] Date of Patent: May 21, 1985

[54] LIGHT INDUCED ETCHING OF INP BY AQUEOUS SOLUTIONS OF $H_3PO_4$

[75] Inventor: John E. Bjorkholm, Holmdel, N.J.

[73] Assignee: AT&T Bell Laboratories, Murray Hill, N.J.

[21] Appl. No.: 474,684

[22] Filed: Mar. 11, 1983

[51] Int. Cl.[3] .................. H01L 21/306; B44C 1/22; C03C 15/00; C03C 25/06

[52] U.S. Cl. .................................. 156/626; 156/635; 156/643; 156/654; 156/662; 156/345; 156/644; 252/79.2

[58] Field of Search .............. 156/626, 635, 643, 654, 156/655, 659.1, 662, 644, 345; 252/79.2; 219/121 LH, 121 LJ, 121 LM; 250/492 R, 492 A; 204/129.3

[56] References Cited

U.S. PATENT DOCUMENTS 3,887,404 6/1975 Chane ........................... 156/647 X
4,351,706 9/1982 Chappell et al. ............... 156/655 X

OTHER PUBLICATIONS

"Laser Enhanced Etching in KOH", Applied Physics Letters, 40(4), Feb. 15, 1982, pp. 352-354, R. J. Von Gutfeld et al.
"Localized Laser Etching of Compound Semiconductors in Aqueous Solutions", Applied Physics Letters, 40(5), Mar. 1, 1982, pp. 391-393, R. M. Osgood et al.
V. Gottschalch et al., *Journal of Materials Science Letters* 1, "Detection of Lattice Defects in InP and (In-Ga)As Using Selective Photoetching", 1982, pp. 358-363.
V. Gottschalch, *Kristall und Technik*, vol. 14, No. 8, "Structural Etching of (001) and (110) Faces of Various A(III)B(V) Compounds", 1979, pp. 939-947.
V. Gottschalch et al., *Kristall und Technik*, vol. 14, No. 5, "$H_3PO_4$—Etching of (001)-Faces of InP, (GaIn)P, GaP, and Ga(AsP)", 1979, pp. 563-569.
T. Kambayash et al., *Japanese Journal of Applied Physics*, vol. 19, No. 1, "Chemical Etching of InP and GaInAsP for Fabricating Laser Diodes and Integrated Optical Circuits", Jan. 1980, pp. 79-85.
S. B. Phatak et al., J. Electrochem. Soc.: Solid-State Science and Technology, vol. 126, No. 2, "Material-Selective Chemical Etching in the System InGaAsP/InP", Feb. 1979, pp. 287-292.
"Etched Mirror and Groove-Coupled GaInAsP/InP Laser Devices for Integrated Optics", *IEEE Journal of Quantum Electronics*, vol. QE-18, Oct. 1982, p. 1679, L. A. Coldren et al.
"Photoelectrochemical Etching of p-GaAs", *Applied Physics Letters*, 39(1), Jul. 1, 1981, p. 76, F. W. Ostermayer, Jr. et al.
"Laser-Photoinduced Etching of Semiconductors and Metals", *Applied Physics Letters*, 37(4), Aug. 15, 1980, p. 344, R. W. Haynes et al.

*Primary Examiner*—William A. Powell
*Attorney, Agent, or Firm*—Erwin W. Pfeifle; Gregory C. Ranieri

[57] ABSTRACT

A method of etching a semiconductor crystal is given. The crystal includes elements selected from one of the groups: (a) indium and phosphorus; (b) gallium and arsenic; (c) aluminum and arsenic. The method comprises the steps of placing the crystal in an aqueous solution of $H_3PO_4$ or HCl, and while the crystal is in contact with the solution illuminating predetermined regions of the crystal with light so that etching proceeds at the illuminated predetermined regions much more rapidly than at nonilluminated regions of the crystal. The method also includes focusing the light to a small spot on the crystal and moving the spot on the crystal so that a groove is etched in the crystal.

7 Claims, 16 Drawing Figures

BUBBLE DEFLECTS
LIGHT BEAM
134

LIGHT INDUCED ETCHING OF INP BY AQUEOUS SOLUTIONS OF H₃PO₄

BACKGROUND OF THE INVENTION

1. Field of the Invention

This invention relates to the wet chemical etching of holes and grooves in semiconductors using a maskless etchant with substantially zero dark etch rate and a light induced etch rate which is easily controllable. As an example, in InP crystal is etched by $H_3PO_4$ under illumination by 5145 Angstroms light, and has a substantially zero dark etch rate.

2. Description of the Prior Art

Heretofore wet chemical etching of semiconductors has utilized methods which require the deposit of a mask. The mask has openings which permit the etchant to contact the surface at only those locations where it is desired for etching to occur. A problem not solved in the prior art is the maskless etching of semiconductor crystals.

A review of etching techniques for GaInAsP/InP structures is given by Coldren et. al. in their article "Etched Mirror and Groove-Coupled GaInAsP/InP Laser Devices for Integrated Optics", published in *IEEE Journal of Quantum Electronics*, Vol. QE-18, pp. 1679–1688, October 1982, which article gives 39 references, all of which are herein referred to for background information.

The use of photoelectrochemical etching has been found to give good light to dark etch ratios, but requires the application of an electric potential in order to remove the etched material, as discussed by Ostermayer et. al. in their article "Photoelectrochemical Etching of P-GaAs" Published in *Applied Physics Letters*, Vol. 39, pp. 76–78, July 1981.

Haynes et. al. in their article "Laser-Photoinduced Etching of Semiconductors and Metals", published in *Applied Physics Letters*, Vol. 37, p. 344, August 1980, used etch solutions of bromine and iodine as active species, dissolved in aqueous solutions containing high concentrations of various corresponding alkali halide salts, specifically NaBr, KBr, CsBR, or NaI, KI, CsI. Laser wavelengths of 4131 Angstroms, 5208 Angstroms, and 6328 Angstroms were used to enhance etching.

In the article by von Gutfeld et al., "Laser Enhanced Etching in KoH", published in *Applied Physics Letters*, Vol. 40, p. 352, February 1982, etching of Si and several ceramic materials submerged in aqueous KOH solution was enhanced by laser illumination. They suggest three important factors in the etching process; (1) direct removal of material through melting; (2) increase in the effective surface area in contact with the etchant; and (3) the local temperature increase which promotes the thermally activated kinetics of etching.

Osgood et. al in their article "Localized Laser Etching of Compound Semiconductors in Aqueous Solution", published in *Applied Physics Letters*, Vol. 40, p. 391, March 1982, used a variety of etchants for various crystals, for example: GaAs (Cr-doped, semi-insulating) in aqueous $H_2SO_4$; GaAs (n-type) in aqueous KOH; CdS (undoped) in aqueous $H_2SO_4$ and $H_2O_2$; and InP (Fe-doped semi-insulating) in aqueous HCl and $HNO_3$. They observed that for photon energies below the bandgap of GaAs, there was no light-induced increase in etching rate for GaAs.

SUMMARY OF THE INVENTION

The problem of providing for semiconductors a wet chemical etch which does not require a mask capable of withstanding the etch has been solved in accordance with the present invention. A light beam is focused to a desired spot size upon the crystal to be etched, for example InP, while the crystal is in contact with a liquid etch solution, for example 10% aqueous $H_3PO_4$, and etching proceeds during illumination and stops in the absence of illumination. The light may, alternatively, be projected in a pattern upon the surface of the crystal and etching proceeds at the brightly illuminated portions of the pattern.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DESCRIPTION OF THE PREFERRED EMBODIMENT

EXAMPLE 1

Figure 1:
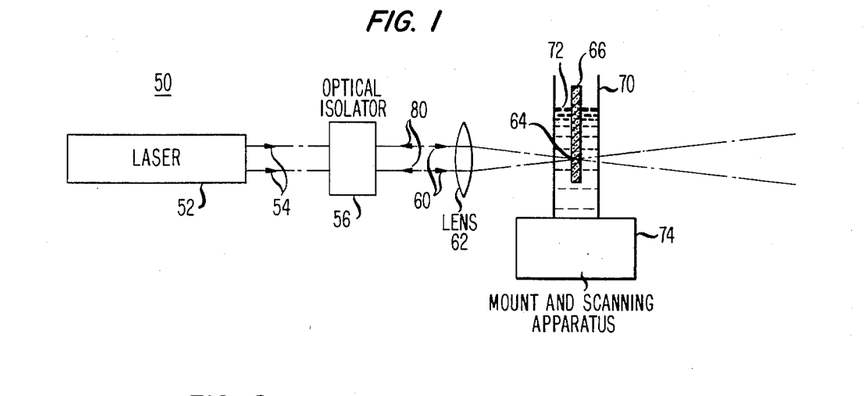
FIG. 1 is a side view showing the light-induced etching apparatus.

Referring to FIG. 1 there is shown a side view of a light-induced etching apparatus 50. Laser 52 produces light beam 52 which first passes through optical isolator 56 and becomes optical beam 60 upon emerging therefrom. Optical beam 60 is focused by lens 62 to a small spot 64. Sample 66 is located at the focal plane of lens 62. Sample 66 is surrounded by container 70 which holds etchant solution 72. Mount and scanning apparatus 74 supports container 70 and sample 66, and provides linear scanning in the direction perpendicular to the plane of FIG. 1. Light beam 60 is focused to spot 64 at the surface of sample 66. Light beam 60 is partly absorbed by sample 66 at spot 64, and is partly reflected as light beam 80. Reflected light beam 80 is substantially prevented from entering laser 52 by optical isolator 56.

During the process of adjusting the optics it is convenient to remove optical isolator 56, tune the laser intensity down to just below its threshold for lasing, and then adjusting the angular orientation of sample 66 so that light beam 80 reflects into laser 52; this additional feedback is sufficient to initiate lasing. When the laser begins to lase as a result of adjusting the orientation of sample 66, then the exposed plane of sample 66 is oriented perpendicular to laser beam 80.

The sample is then adjusted to lie at the focal spot of laser beam 60 as focused by lens 62 by observing the threshold for lasing. The sample is located at the focus when the threshold for lasing has a minimum value as the sample is moved along the laser beam.

Figure 2:
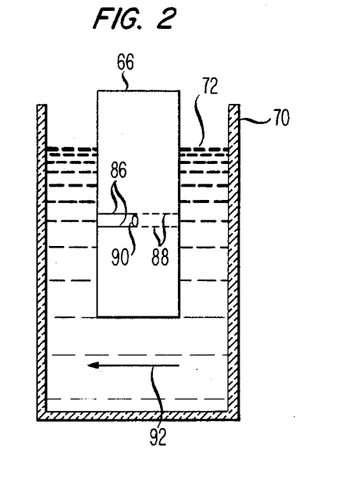
FIG. 2 is a front view of a crystal during etching.

By translating container 70 in the plane perpendicular to the plane of FIG. 1, spot 64 sweeps out a line on sample 66 as is shown in front view in FIG. 2. Solid lines 86 show the edges of a groove etched into sample 66. Dashed lines 88 show the track which light beam spot 64, reference numeral 90 in front view, will sweep out. Arrow 92 shows the direction of motion of sample 66. Laser beam 54 remains stationary as sample 66 moves in the focal plane of lens 62. Alternatively, sample 66 may remain stationary as laser beam 54 is moved with respect to sample 66.

Figure 3:
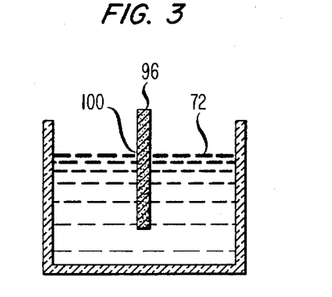
FIG. 3 is a side view showing the apparatus used to measure the dark etch rate.
Figure 4:
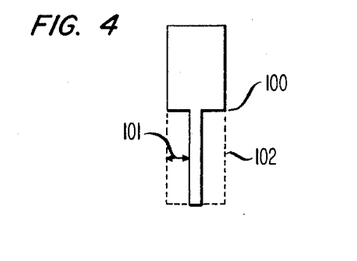
FIG. 4 is a side view showing a dark etch rate.

Referring to FIG. 3, a sample 96 is shown in position in etchant 72 for the purpose of measuring the dark etch rate. FIG. 4 shows an edge view of a sample which experienced a dark etch rate. Sample 96 is submerged to line 100 for a fixed time. The volume of material 102 removed from one face during the submerged time gives the dark etch rate. Alternatively, the dark etch rate may be measured by the depth of step 101 as a measure of the volume of material removed during the submerged time.

A light beam spot size may be specified by the parameter $w_o$ for a light beam which has a substantially Gaussian intensity profile. The following formula is fitted to the light beam intensity profile:

$$I(r) = I_o e^{-2r^2/w_o^2}$$

In the equation, $I_o$ is the intensity at the center of the light beam, r is the radius at which the intensity is evaluated (measured from the center of the light beam), and $w_o$ is a parameter which gives the spot size. The parameter $w_o$ will be referred to as the light beam "spot size" in this patent.

The depth of a depression or of a surface irregularity may be measured by a method referred to as "alpha stepped". The method uses, for example, a probe which touches the surface and which registers the depth of a surface irregularity on a dial. Equipment manufactured for alpha stepped measurements includes, for example, Alpha Step Model 10-00020 made by Tencor Instruments, Inc. The alpha stepped method is of sufficient sensitivity that surface features of 0.5 micron may be readily measured.

EXAMPLE 2

Continuous wave argon laser light at 5145 Angstroms was used to induce rapid localized etching of InP samples immersed in aqueous solutions of phosphoric acid. No etching of the samples was observed in the absence of the light. Typically the etchant was a (1:9) solution of concentrated $H_3PO_4$ in deionized water. As an example of the etch rates attained, 100 μm diameter holes were etched through 250 μm thick samples in 30 sec. using 2W of light focused on the sample to a spot diameter of about 20 μm.

Grooves were etched in a planar face of the samples. Typical grooves obtained with 700 mW of light focused to a 20 μm diameter spot and using a scan rate of 40 μm/sec measured 15 μm wide and 15 μm deep. The grooves have rounded bottoms and steeply sloping walls. For a given scan rate there is a small range of "optimum powers" which yield continuous, straight, smooth grooves. For powers slightly above or below this power range the grooves that result are discontinuous, irregular in width and depth, and not straight. The optimum powers and volumetric etch rates for semi-insulating, undoped (slightly n-type), and heavily n-type samples are similar. The optimum powers are lower and the etch rates are faster for p-type material. Luminescence studies of the samples after etching indicate that the etching process causes little damage to the surrounding material.

Figure 5:
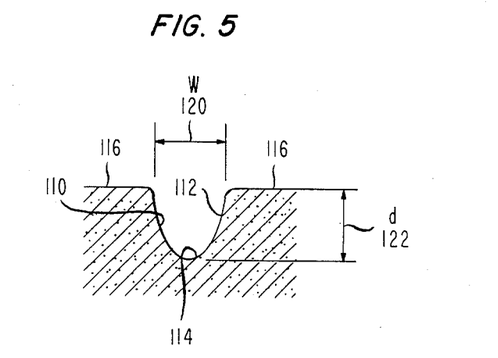
FIG. 5 is a side view of an etched groove which was exposed by cleaving.

Referring to FIG. 5 there is shown a profile of a typical groove etched as described hereinabove. The profile as obtained by cleaving the crystal along a plane substantially perpendicular to the groove and photographing the groove through a microscope. Sides 110, 112 are smooth and sloping and do not follow any particular crystal plane. Bottom 114 is rounded. Surface 116 is substantially free of debris. Width W 120 and depth d 122 are controlled by the light power, the scan speed at which the crystal is moved, the light spot size, and the constituents and concentration of the etchant.

Figure 6:
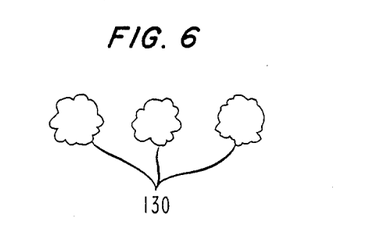
FIG. 6 is a top view of discontinuous groove etched in pure water.

Referring to FIG. 6, there is shown a series of discontinuous holes 130 rather than a smooth uniform groove. Such discontinuous holes may be etched if the light power is too great, if the light power is too little, if the etchant is pure water rather than a solution of $H_3PO_4$, or by other combinations of reaction conditions. Depths of discontinuous holes may be as much as 50 to 100 microns rather than grooves of depths of 10 to 20 microns.

Figure 7:
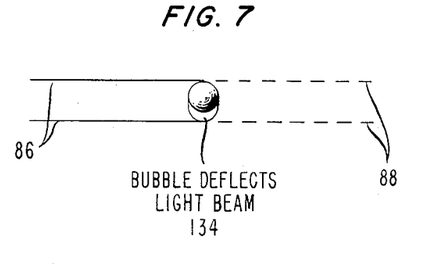
FIG. 7 is a front view of an etched groove showing gas bubble formation.

Referring to FIG. 7, there is shown a bubble 134 of gas which forms when excessive light power is used. The bubbles 134 forms in the vicinity of the focal spot 64. The bubble 134 deflects the light beam from focal spot 64, thereby leading to discontinuous etching rather than etching of a smooth groove.

A number of light intensity conditions and etchant concentration conditions have been studied.

EXAMPLE 3

Etch Hole, no scanning of Sample

Light power 1W
Lens 10 cm focal length
Methanol etchant

Good holes produced. However, piles of material piled up on the surface near the hole.

EXAMPLE 4

Light power 3W
Lens focal length 10 cm
Sample thickness 200 micron
Light spot size: focal spot ≃50 micron
Etchant 10% $H_3PO_4$ in $H_2O$ A hole of diameter approximately 250 microns was produced in several minutes. The sample may not have been located in the focal plane of the lens.

EXAMPLE 5

Light power 2W
Lens 4.3 cm focal length
Light spot size $w_o \simeq 8$ micron
Etchant 10% $H_2SO_4$ in $H_2O$ A hole formed in 90 sec. and was completely etched after 120 sec. The sample may not be in the plane of the lens.

In Example 6 through Example 8 the etchant is 10% $H_3PO_4$ in water.

EXAMPLE 6

Light power 1W
Lens 4.25 cm focal length

Some etching of the sample occurred but after 5 min. there was not a hole through the 200 micron-thick sample.

EXAMPLE 7

Light power 2W
Lens 4.25 cm focal length
Focal spot $\approx 5$ micron

Light begins to break through 200 micron-thick sample within 25 sec. and is fully through at 30 sec. The hole is quite clean and the alpha step measurement confirms. The hole diameter is 250 micron. The hole on the rear surface is smaller and is oblong shaped.

EXAMPLE 8

Light power 1.5W
Lens 4.25 cm focal length
Spot focal size $w_o \simeq 5$ microns The light breaks through the sample in 45 sec. and full transmission occurs in 50 sec. Hole diameter is 100 to 125 microns, and is smaller on rear surface. The surrounding area is smooth.

Table 1, as follows, gives Example 9 through Example 42. Accurate measurements of the laser beam used in the example given in Table 1 are: (a) the spot size incident onto the 4.25 cm focal length lens is $w_o = 1.1$ mm; (b) the focal spot size in air of the above-mentioned 4.25 cm focal length lens is $w_o = 9$ micron. Note that $2w_o = 18$ micron and the groove width for Example 23 is 20 micron. Thus, grooves can be etched with widths of approximately the spot size, $2w_o$. An undoped InP crystal was used. Optical isolator 56 shown in FIG. 1 was not installed.

The sample was scanned to etch grooves. The following etch conditions apply to the examples given in Table 1.
Etchant 10% $H_3PO_4$ in $H_2O$
Lens 4.25 cm focal length adjust focus accurately
focal spot size $w_o = 9$ micron

TABLE 1

| Example | Good Groove | Scan Speed mm/sec. | Light Power Watt | Depth Microns | Width Microns | Comments |
|---|---|---|---|---|---|---|
| 9 |  | 1 | 2 | 3.5 | — | rough edges |
| 10 |  | 2 | 2 | $\simeq 1$ | — | discontinuous holes |
| 11 |  | 4 | 2 |  | 43 | smooth groove |
|  | X | 0.4 | 2 | 3 |  |  |
| 12 |  | 1 | 4 | 2.5 | — | discontinuous holes |
| 13 |  | 2 | 4 | 1.75 | — | discontinuous holes |
| 14 |  | 4 | 4 |  | — | discontinuous holes |
| 15 |  | 0.4 | 4 | 3.8 | — | groove with jagged and broken sides |
| 16 |  | 0.2 | 2 | 20 | — | jagged sides |
| 17 |  | 0.2 | 1.5 | 5.0 | 35 | smooth groove |
| 18 | X | 0.2 | 1.4 |  | over 8 | smooth sides |
| 19 |  | 0.1 | 1.4 | X | — | grooves broken up by bubbles clinging to sample |
| 20 |  | 0.2 | 1.0 | X | — | grooves broken up by bubbles clinging to sample |
| 21 | X | 0.1 | 1.0 | 7 | 25 | smooth straight sides |
| 22 |  | 0.04 | 0.5 | <1.0 |  | no groove shows on S.E.M. |
| 23 | X | 0.04 | 0.75 | 10 | 20 | vertical smooth walls, the best groove through this example. |
| 24 | X | 0.4 | 2.4 | 15 | 50 | smooth sides |
| 25 | X | 0.4 | 2.0 | 11 | 45 | smooth sides |
| 26 | X | 0.4 | 3.0 | 7 | 65 | smooth sides |
| 27 |  | 1 | 4.4 |  | — | shallow |
| 28 |  | 1 | 3.9 |  | — | shallow |
| 29 |  | 0.02 | 0.5 |  | — | very shallow |
| 30 |  | 0.02 | 0.6 |  | — | very shallow |
| 31 |  | 0.02 | 0.7 |  | — | very shallow |
| 32 |  | 0.68 | 3 |  | — |  |
| 33 |  | 0.68 | 3.5 |  |  |  |
| 35 |  | 0.68 | 2.5 |  |  |  |
| 36 |  | 0.68 | 3 |  |  |  |
| 37 |  | 0.68 | 2.5 |  |  |  |
| 38 |  | 0.04 | 0.75 | not uniform | 20 |  |
| 39 | X | 0.04 | 0.8 | 15 | 23 |  |
| 40 | X | 0.04 | 0.78 | 15 | 20 |  |
| 41 | X | 0.04 | 0.78 | 15 | 20 |  |

TABLE 1-continued

| Example | Good Groove | Scan Speed mm/sec. | Light Power Watt | Description of Grooves | | Comments |
|---|---|---|---|---|---|---|
| | | | | Depth Microns | Width Microns | |
| 42 | X | 0.04 | 0.78 | 15 | 22.5 | |

An optical isolator 56 shown in FIG. 1 was installed in the laser beam to avoid reflections from the sample causing gain fluctuations in laser 52. However, as mentioned hereinabove, observation of laser gain fluctuations was used to adjust the sample into the focal spot. In Table 2 are presented Examples 43 through 51, and the parameters are:
Etchant 10% $H_3PO_4$ in $H_2O$
Lens 4.25 cm focal length
Spot size in focal plane $w_o = 9$ micron
Optical isolator installed

TABLE 2

| Example | Good Groove | Scan Speed mm/sec | Light Power Watt | Description of Groove | |
|---|---|---|---|---|---|
| | | | | Width Micron | Depth Micron |
| 43 | | 0.4 | No good results found for power 1.25 W through 2.5 Watt | | |
| 44 | X | 0.2 | 1.25 | 25 | 8 |
| 45 | X | 0.2 | 1.5 | 30 | 12 |
| 46 | X | 0.1 | 1.0 | 21 | 8 |
| 47 | X | 0.1 | 1.2 | 20 | 14 |
| 48 | X | 0.04 | 0.6 | 12 | 8 |
| 49 | X | 0.04 | 0.6 | 15 | 10–15 |
| 50 | X | 0.04 | 0.7 | 14 | 10 |
| 51 | X | 0.04 | 0.75 | 16 | 15 |

For powers less than the smallest for each scan speed given in Table 2, the grooves tend to be discontinuous and the width and depth vary erratically.

Figure 8:
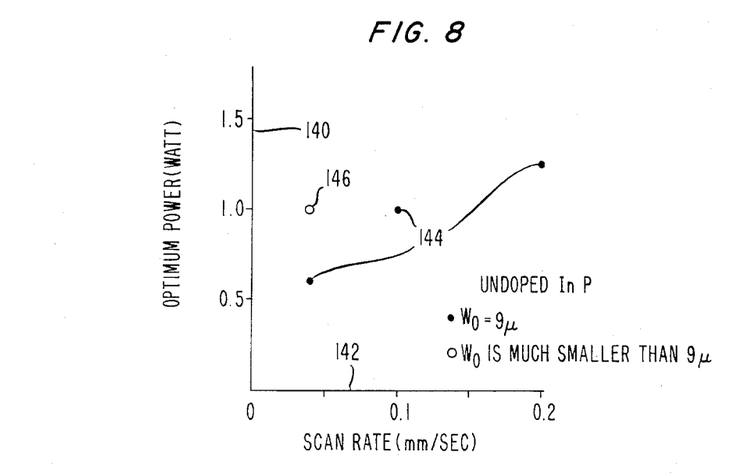
FIG. 8 is a graph showing "optimum power" plotted versus scan rate.

A trend may be recognized from the foregoing examples through the definition of a quantity called "optimum power". Optimum power is defined as the least light beam power which gives continuous "good" grooves of substantially constant depth. The optimum power is the minimum power for etching good grooves. Referring to FIG. 8, there is shown a graph of "optimum power" defined hereinabove plotted along the vertical axis 140 versus scan rate plotted along the horizontal axis 142. The data points 144 for a beam width parameter $w_o = 9$ micron are shown as solid points, and a data point 146 for $w_o$ = approximately 2 microns is shown as an open circle.

Grooves etched with the same conditions as shown in Table 2 but with a light spot size of approximately 2.0 micron are given in Table 3.

TABLE 3

| Example | Good Groove | Scan Speed mm/sec | Light Power Watt | Description of Groove | |
|---|---|---|---|---|---|
| | | | | Width Micron | Depth Micron |
| 52 | * | .04 | 1 | 10 | 10 |
| 53 | * | .04 | 1.2 | 12.5 | 16 |

EXAMPLE 54

Grooves etched as in Example 52 are excellent. Using the conditions of Example 52, 5 grooves of less than 10 microns width and separated by 25 microns were etched with a scan speed of 0.04 mm/sec and light power of 1 Watt.

EXAMPLE 55

Shallow depressions are etched with light power of 40 milliwatt. Such depressions may be etched during adjustment of the sample and the laser before beginning an etch run.

EXAMPLE 56

Flourescence of InP surfaces is used as an indication of surface quality. Samples before etching have a good flourescence. Samples after etching have poor flourescence. However, flourescence may be restored to etched samples by treating them as follows: (a) submerged for 2 to 3 minutes in buffered HF; (b) submerged for 2 minutes in 2:1 glacial acetic acid: 30% $H_2O_2$. Restoration of flourescence by the above treatment indicates that the surface is oxidized during etching, and the oxide layer suppresses flourescence.

EXAMPLE 57

Etching in pure deionized water using the laser beam with $w_o = 9$ microns was attempted. The etch produces a series of strung together deep holes. The smoothest line of holes is produced with a scan rate by 0.04 mm/sec and with a laser power of 0.7 Watt. The holes resemble a periodic structure seen in the good grooves produced with $H_3PO_4$ etchant.

EXAMPLE 58

An etchant concentration of 20% $H_3PO_4$ gives an optimum scan rate of 0.04 mm/sec with a light power of 0.7 Watt. Grooves are shallower but smoother than those produced with 10% $H_3PO_4$. A conclusion is that optimum scan rate is independent of concentration of $H_3PO_4$. Thus the concentration of $H_3PO_4$ may be chosen to produce the shape of groove which is desired.

EXAMPLE 59

The dark etch rate of InP in a 10% $H_3PO_4$ aqueous solution was measured as shown in FIG. 3. Sample 96 was suspended in the etchant for 76 minutes. Removed material 102, as shown in FIG. 4, provides a step at location 100 which was at the surface of the etchant. The sample was alpha stepped in order to measure the step at location 100. No step was observed. The measurement technique was sensitive to a step of 0.5 micron which would show very clearly. The step was much less than 0.5 micron. The dark etch rate may be estimated as less than:

$$\text{Dark Etch Rate} < \frac{0.5 \text{ micron}}{76 \text{ min } 60 \frac{\text{sec}}{\text{min}}} = 10^{-4} \text{micron/sec}$$

The etch rate for hole etching can be estimated from the data: 30 seconds are required to go through a 250 micron sample.

Etch Rate = 250 micron/30 sec = 8 micron/sec The light induced enhancement is therefore $8 \times 10^4$.

The etch rate for groove etching can be estimated from the following data: light power 1 Watt; groove 20 micron wide; groove 10 micron deep; scan speed 0.1 mm/sec=100 micron/sec;

$$\text{time spent on a spot} = \frac{20 \text{ micron}}{100 \text{ micron/sec}} = 1/5 \text{ sec}$$

$$\text{Etch rate} = \frac{10 \text{ micron deep}}{1/5 \text{ sec}} = 50 \text{ micron/sec}$$

The light induced enhancement is therefore $5 \times 10^5$.

EXAMPLE 60

Figure 9:
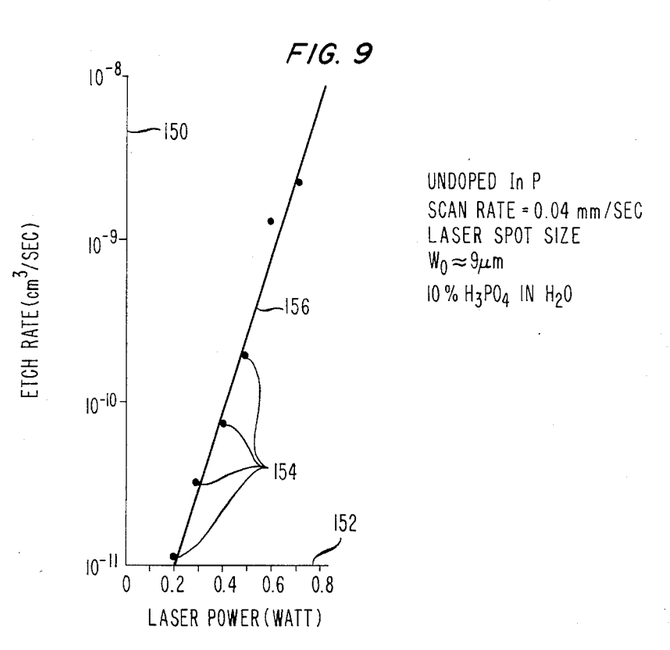
FIG. 9 is a semilog graph showing etch rate vs. light power.

Referring to FIG. 9, there is shown a graph of logarithm of the etch rate plotted along vertical axis 150 versus laser power plotted along horizontal axis 152. The graph is plotted on semilogarithmic paper. The data points 154 fall very close to straight line 156 which was drawn to connect the points. The proximity of data points 154 to a straight line as shown in FIG. 9 is an indication that the etch rate is an exponential function of light power.

A theory which predicts an exponential dependence of a chemical reaction rate is the theory that the controlling independent variable is temperature. Since the light power affects the temperature of the sample by which it is absorbed, the graph shown in FIG. 9 supports the theory that the enhancement of etch rate by the light beam is due to a temperature rise of the sample. In addition to a temperature rise of the sample, excitation of electrons and holes in the sample may increase the chemical reactivity of the sample.

The method of light enhanced etching using an etchant with a low dark etch rate is expected to work on compounds containing In and P such as GaInAsP and other quaternaries, and also compounds such as GaAs, GaAlAs, and InGaAlAs. Also semi-insulating InP with doping of Fe or Mn or other similar acceptor materials is expected to exhibit light enhanced etching. Localized heating of the crystal by the light beam is believed to account for the dominant mechanisms involved in the enhancement of etching by light. Therefore light which is absorbed by similar materials will have a similar effect of enhancing their etching.

EXAMPLE 61

Figure 10:
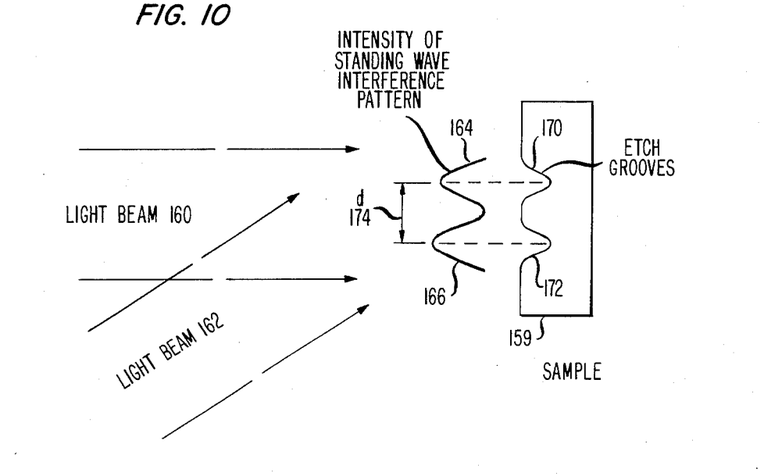
FIG. 10 is a top view showing an illumination pattern produced upon a crystal surface by interference.

Referring to FIG. 10, there are shown two light beams 160, 162 which converge at the surface of a sample 159 to be etched. The light beams 160, 162 interfere and produce bright fringes, two of which are shown, 164, 166. At locations where the bright fringes 164, 166 illuminate sample 159, etching of sample 159 is enhanced and produces grooves 170, 172. The fringe spacing d 174 should be kept larger than the heat diffusion length of the sample as it is submerged in the etchant solution.

EXAMPLE 62

Figure 11:
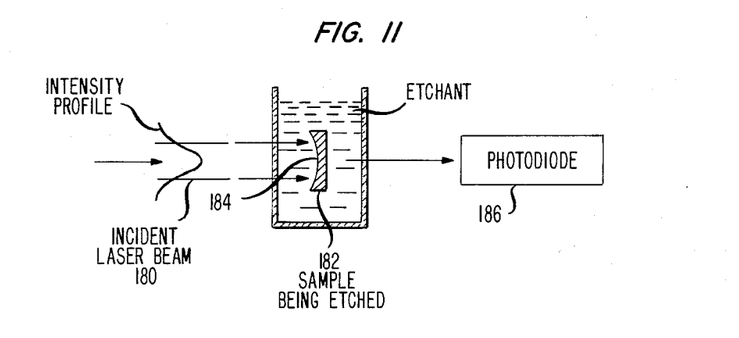
FIG. 11 is a side view showing a sample being etched into a thin cross section by a broad light beam.

A thin sample for transmission electron microscopy may be made using light enhanced etching. Referring to FIG. 11, there is shown a light beam 180 with an approximately Gaussian intensity profile. The laser beam is spread out to a $w_o$ of approximately 0.5 cm. Light beam 180 illuminates sample 182 and thereby enhances its etching. Because light beam 180 is of greatest intensity at its center, the etching of sample 182 proceeds most rapidly near its center 184. A photodiode 186 may be used to monitor penetration by light beam 180 through sample 182. In one mode of operation, etching may be allowed to proceed until the light beam 180 penetrates sample 182, and then may be halted by turning off light beam 180 when photodiode 186 senses light penetration of sample 182. This mode of operation would produce a sample with a small hole and with very thin edges surrounding the hole. Such thin edges make an ideal target for a transmission electron microsope.

EXAMPLE 63

Figure 12:
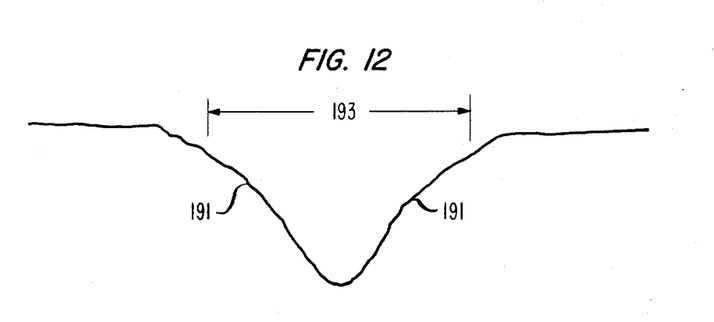
FIG. 12 is a profile of a sample etched by a broad light beam as shown in FIG. 11.

A typical depression etched by a broadened Gaussian profile light beam is shown in FIG. 12. The profile is seen to have smooth sides 191. Also the profile has a width 193 corresponding to the width of the light beam. For example, width 193 may be a few millimeters.

EXAMPLE 64

Figure 13:
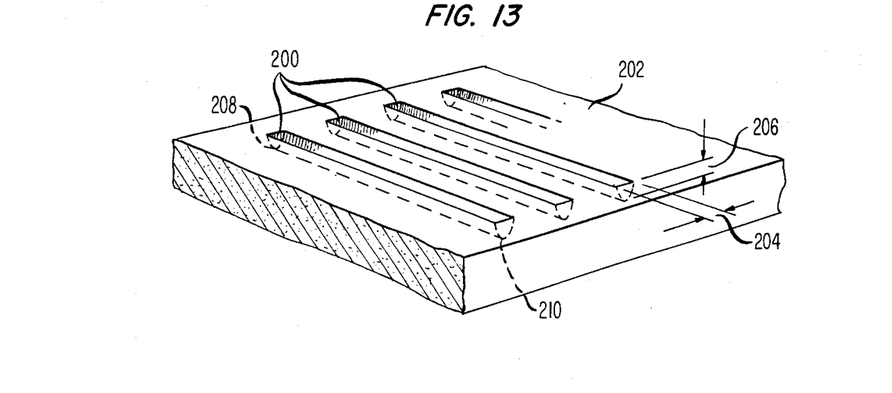
FIG. 13 is an isometric view of a series of parallel etched grooves.

Referring to FIG. 13, there is shown an isometric view of a series of parallel grooves 200 etched in a crystal of InP 202. Grooves 200 have a width 204 and a depth 206. Control of the etching process is illustrated by the ends 208, 210 of the grooves. Etching stops when the light beam 54 is turned off.

EXAMPLE 65

Selective etching of materials with different bandgap energies is accomplished by tuning the laser photon energy. Etching of a layer of material with a smaller bandgap energy while selectively not etching another material with a higher bandgap energy is done by tuning the laser photon energy between the two bandgaps. Then absorption occurs and etching proceeds in the lower bandgap material. Etching does not proceed in the wider bandgap material because very little light absorption occurs due to the wider bandgap.

For example, the bandgap of InP is around 1.0 micron photons, whereas that of InGaAsP is around 1.3 micron photons, and therefore light of the correct wavelength is absorbed by the InGaAsP and not the InP. Thus with the proper etchant solution the InGaAsP may be selectively etched.

Alternatively an etch can be selective if two materials have quite different threshold intensities, or if absorption is nonlinear, or if they have very different nonlinearities.

EXAMPLE 66

A 10% HCl in $H_2O$ solution was used as an etchant for InP. The scan rate was 0.04 mm/sec and light power of 0.75 Watt. A very nice groove of 14 microns wide by 10 microns deep was produced.

Conditions of scan speed of 0.1 mm/sec with light power of 1.0, 1.25, or 1.5 Watt did not give good etching.

EXAMPLE 67A

A sample of n-doped InP, doped with sulfur at a concentration of $n \simeq 5 \; 10^{18}$ cm$^{-3}$, was etched. The conditions of 10% aqueous $H_3PO_4$, a scan rate of 0.04 mm/sec, and a light power of 0.75 Watt provided excellent etching results. A groove of 15–16 microns width and 18 microns depth was etched.

Additional examples of etching of n-doped InP with doping of sulphur at a concentration of $n \simeq 5 \times 10^{18}$ cm$^{-3}$ are given in Table 4.

TABLE 4 n-type InP sulfur doped n ≃ 5-10^18 cm^3, 10% H_3PO_4

| Example | Quality of Groove | Scan Speed mm/sec | Light Power Watt | Description of Groove Width Micron | Depth Micron | Etch Rate Micron^3/sec |
|---|---|---|---|---|---|---|
| 67 | good-smooth | .04 | .8 | 19 | 20 | 15.2 × 10^3 |
| 68 | good-smooth | .04 | .8 | 19 | 19 | 14.4 × 10^3 |
| 69 | good-smooth | .04 | .75 | 18 | 16 | 11.5 × 10^3 |
| 70 | good-smooth | .1 | 1.0 | 24 | 12 | 28.8 × 10^3 |
| 71 | good-smooth | .1 | 0.9 | 21 | 8 | 16.8 × 10^3 |

The results given in Examples 67 through 71 do not differ greatly from the results obtained with undoped InP.

Etching of p-doped InP, doped with zinc at a concentration of $p \simeq 2 \times 10^{18}$ cm$^{-3}$ using 10% H$_3$PO$_4$ was done. Table 5 gives examples of conditions which gave etched grooves.

TABLE 5 p-doped InP doped with zinc, $p \simeq 2 \times 10^{18}$ cm$^3$
10% H_3PO_4

| Example | Quality of Groove | Scan Speed mm/sec | Light Power Watt | Description of Groove Width Micron | Depth Micron |
|---|---|---|---|---|---|
| 72 | good but not optimum | .04 | 0.8 | — | — |
| 72 | continuous & straight | .04 | 0.7 | 19 | 15 |
| 73 | continuous & straight | .04 | 0.6 | 19 | 13 |
| 74 | good | .04 | .65 | 19 | 13 |
| 75 | good | .04 | .6 | 19 | 13 |
| 76 | best | .04 | .5 | 16 | 12 |
| 77 | best | .04 | .4 | 15 | 7 |
| 78 | good but not optimum | .1 | 1.2 | — | — |
| 79 | good but not optimum | .1 | 1.0 | — | — |
| 80 | best | .1 | .8 | 22 | 14 |
| 81 | best | .1 | .7 | 19 | 10 |

EXAMPLE 82

Figure 14:
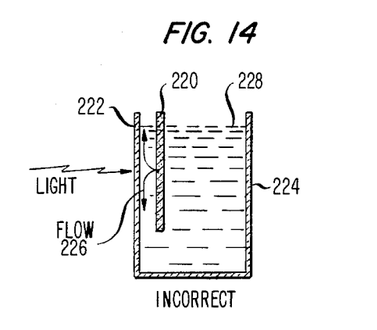
FIG. 14 is a side view showing flow patterns in etchant solution.
Figure 15:
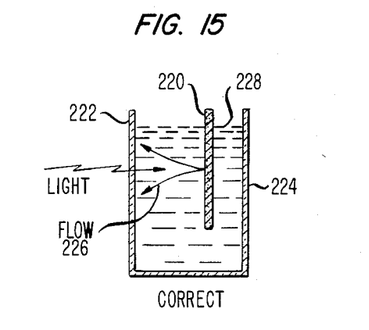
FIG. 15 is a side view showing flow patterns in etchant solution.

Care must be exercised in placing a sample to be etched within an etchant container. Flow within the solution may impinge on the inner surface of the container. Flow turbulence generated by currents impinging upon the inner surface of the container may disturb the light beam focus, may wash against the sample surface where they deposit material or etch away the surface, or may otherwise interfere with the etching process. Referring to FIG. 14 and FIG. 15, there are shown flows in an incorrect and correct placement, respectively. In FIG. 14 the sample 220 is too close to wall 222 of container 224, and flow 226 strikes wall 222 causing turbulence in etchant solution 228.

In FIG. 15 sample 220 is further away from wall 222 and so flow 226 does not cause turbulence and does not disturb light beam 230. Flow 226 also does not deposit material or cause unwanted etching of other parts of sample 220.

EXAMPLE 83

Figure 16:
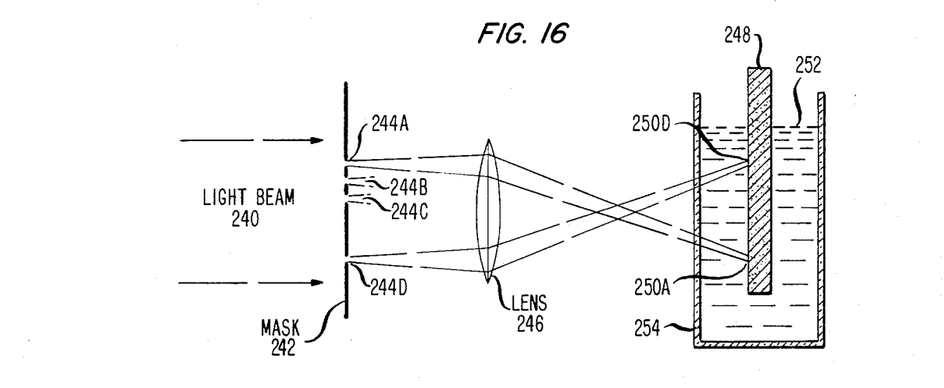
FIG. 16 is a side view of a mask which is imaged onto a sample by a lens.

A light beam may illuminate a mask, and an image of the mask may be focused upon a sample to be etched. The mask is not in contact with the sample, and is not immersed in the etchant. Referring to FIG. 16, there is shown a light beam 240 which illuminates an opaque mask 242 which has a transparent pattern, for example transparent locations 224A, 244B, 244C, and 244D. Light passing through transparent openings is focused by lens 246 onto sample 248. For example, transparent location 244A is focused to location 250A where it illuminates sample 248. Also, for example, transparent locatio 244D is focused by lens 246 to location 250D on sample 248 where sample 248 is illuminated. Sample 248 is immersed in etchant solution 252 which is held in container 254. Etching proceeds rapidly at illuminated regions of sample 248, for example location 250A and location 250D. The pattern of mask 242 may thereby be etched into sample 248 as a pattern of grooves.

Semi-insulating InP doped with Fe was etched using an etchant of 10% H$_3$PO$_4$ in water. A lens of focal length 4.25 cm with a light spot size $w_o = 9$ microns was used. Good grooves were etched with the conditions of light intensity and scan rate given in Table 6.

TABLE 6

Semi-insulating Fe doped InP
etchant 10% H_3PO_4 in water
light spot size $^3w_o = 9$ micron

| Example | Quality of Groove | Scan Speed mm/sec | Light Power Watt | Description of Groove Width Micron | Depth Micron |
|---|---|---|---|---|---|
| 84 | good but depth varies somewhat | .04 | .6 | 16 | 10 |
| 85 | best, constant depth | .04 | .7 | 18 | 16 |
| 86 | good | .04 | .8 | 20 | 20 |

The following materials are suitable for etching in aqueous H$_3$PO$_4$ under the influence of illumination by light while in contact with the H$_3$PO$_4$ solution: undoped InP, p-doped InP, n-doped InP, Fe-doped semi-insulating InP, compensated doped InP, alloys of InP and As, alloys of InP and GaAs, and alloys of InGaAlAs.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of etching a predetermined pattern into a Group III-V semiconductor crystal comprising the steps of:

placing said crystal in an aqueous solution of H$_3$PO$_4$;

while said crystal is in contact with said solution, illuminating predetermined regions of said crystal with light so that etching proceeds at said illuminated predetermined regions;

focusing said light to a spot having a spot size less than 500 Angstroms on said crystal; and moving said spot on said crystal so that a groove is etched in said crystal.

2. The method as claimed in claim 1 wherein said moving said spot on said crystal is done by moving said crystal.

3. The method as claimed in claim 1 wherein said moving said spot on said crystal is done by scanning a light beam which provides said light.

4. A method of etching a predetermined pattern into a Group III-V semiconductor crystal comprising the steps of:

placing said crystal in an aqueous solution of $H_3PO_4$;

while said crystal is in contact with said solution, generating a standing wave pattern of light on a surface of said crystal so that etching proceeds at the location of bright regions of said standing wave pattern.

5. A method of etching a predetermined pattern of grooves into a Group III-V semiconductor crystal comprising the steps of:

spacing said crystal in an aqueous solution of $H_3PO_4$;

while said crystal is in contact with said solution, illuminating regions of said crystal with light;

directing said light through a pattern which has opaque areas and transparent areas so that said light illuminates said regions of said crystal in accordance with said pattern, and etching of said grooves proceeds at said illuminated regions, wherein said pattern is spaced apart from said crystal.

6. A method of etching a Group III-V semiconductor crystal comprising:

placing said crystal in an etchant of an aqueous solution of $H_3PO_4$;

while said crystal is in contact with said solution, illuminating said crystal with light;

detecting a portion of said light which penetrates said crystal; and controlling the intensity of said light in response to the detected portion of said light so that at least one region of predetermined thickness is etched in said crystal.

7. The method of etching a crystal as in claim 6 wherein said crystal has a hole etched through it.

* * * * *

UNITED STATES PATENT AND TRADEMARK OFFICE
CERTIFICATE OF CORRECTION

PATENT NO. : 4,518,456
DATED : May 21, 1985
INVENTOR(S) : John E. Bjorkholm

It is certified that error appears in the above-identified patent and that said Letters Patent is hereby corrected as shown below:

Column 2, line 60, "52" should read --54--. Column 3, line 44, "$w_o2$" should read --$w_o^2$--. Column 4, line 45, "bubbles" should read --bubble--.

Column 12, line 9, "224A" should read --244A--; line 14, "locatio" should read --location--. Column 13, line 15, "spacing" should read --placing--.

Signed and Sealed this

Fourteenth Day of January 1986

[SEAL]

Attest:

DONALD J. QUIGG

Attesting Officer

Commissioner of Patents and Trademarks